United States Patent [19]

Durand

[11] Patent Number: 4,656,314
[45] Date of Patent: Apr. 7, 1987

[54] PRINTED CIRCUIT

[75] Inventor: David Durand, Portsmouth, R.I.

[73] Assignee: Industrial Science Associates, East Providence, R.I.

[21] Appl. No.: 789,713

[22] Filed: Oct. 21, 1985

Related U.S. Application Data

[62] Division of Ser. No. 508,000, Jun. 27, 1983, abandoned, which is a division of Ser. No. 346,941, Feb. 8, 1982, Pat. No. 4,401,686.

[51] Int. Cl.[4] .................................................. H05K 3/14
[52] U.S. Cl. .............................. 174/68.5; 339/17 D; 361/411
[58] Field of Search ........................ 174/68.5; 361/411

[56] References Cited

U.S. PATENT DOCUMENTS

| Re. 30,274 | 5/1980 | Bolon et al. | 361/411 |
| 2,739,881 | 3/1956 | Kepple | 427/96 X |
| 3,330,695 | 7/1967 | Curran | 427/96 X |
| 3,516,855 | 6/1970 | Goll et al. | 427/96 |
| 3,699,027 | 2/1970 | Miller | 427/13 |
| 4,049,844 | 9/1977 | Bolon | 427/54.1 |
| 4,152,195 | 5/1979 | Bahrel | 427/96 |
| 4,157,407 | 6/1979 | Peiffer | 427/54.1 |
| 4,280,888 | 7/1981 | Bush et al. | 427/54.1 |
| 4,288,282 | 9/1981 | Brown et al. | 156/630 |
| 4,303,698 | 12/1981 | Beske et al. | 427/96 |
| 4,327,124 | 4/1982 | Des Marais, Jr. | 427/96 |
| 4,421,944 | 12/1983 | Des Marais | 174/68.5 |

FOREIGN PATENT DOCUMENTS 0045466  2/1982  European Pat. Off. ................ 96/

Primary Examiner—R. R. Kuela
Attorney, Agent, or Firm—Cushman, Darby & Cushman

[57] ABSTRACT

An ultraviolet reactive ink is applied to a translucent substrate in the desired circuit image and partially cured to a tacky state with ultraviolet radiation. A resist material is then applied to the substrate in the negative circuit image and metallic particles are deposited on the ink by vacuum deposition. The ink is then further cured to a hardened state with ultraviolet radiation applied from both above and beneath the substrate to counteract the tendency of the metal to reflect radiation applied only from above the substrate. Finally, the resist material is removed from the substrate leaving the fully formed circuit board comprising the substrate, the fully cured ink circuit image bonded thereto, and a metallic conductive layer on the ink.

24 Claims, 17 Drawing Figures

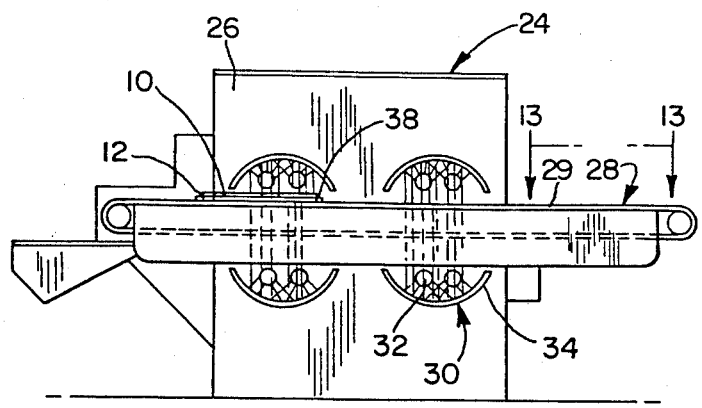
FIG. 9
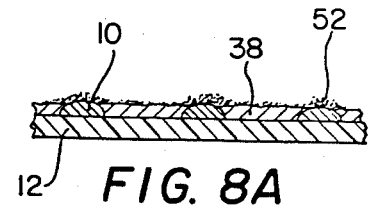
FIG. 8A
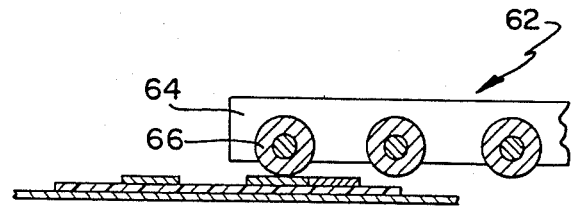
FIG. 10
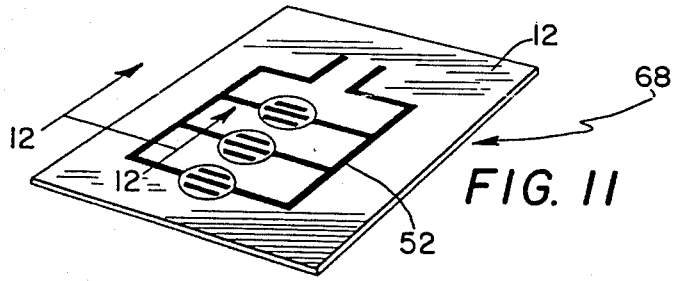
FIG. 11
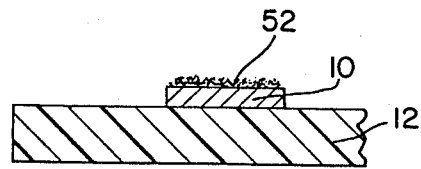
FIG. 12
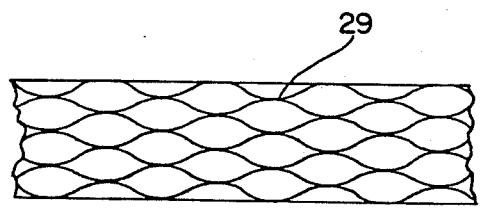
FIG. 13
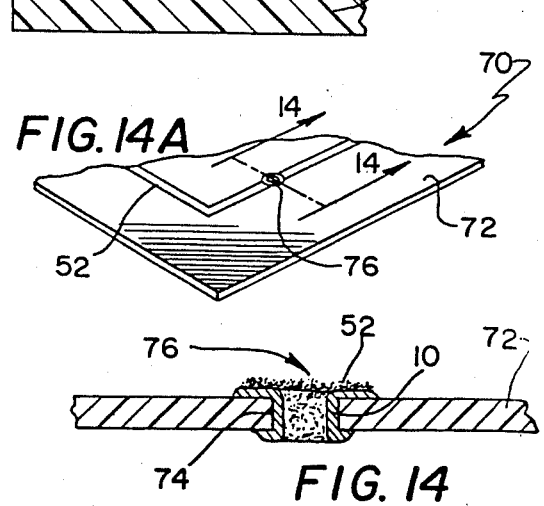
FIG. 14A
FIG. 14
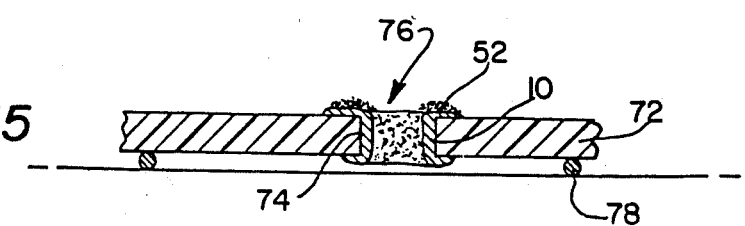
FIG. 15

PRINTED CIRCUIT

This is a division of application Ser. No. 508,000, filed June 27, 1983, now abandoned, which is a Rule 60 divisional of Ser. No. 346,941, filed Feb. 8, 1982, now U.S. Pat. No. 4,401,686.

BACKGROUND AND SUMMARY OF THE INVENTION

The instant invention relates to electrically conductive printed circuits and more particularly to a novel method of forming an electrically conductive printed circuit on a translucent substrate.

Printed circuit boards have found wide application in many areas of today's "electronic society". In this regard, a number of different types of both rigid and flexible printed circuit boards are currently available for applications ranging from electronic game devices to space shuttle computer systems. Rigid printed circuit boards are currently used in nearly all phases of the electronic industry and in low-voltage applications they have virtually replaced the more traditional forms of circuitry wherein individual wires are connected to the various components of the circuit. So-called flexible or membrane circuit boards have recently gained wide acceptance in electrical keyboard constructions wherein a key on a keyboard is depressed to flex a particular area of a membrane circuit to cause that area to be moved into engagement with a stationary circuit element to effect electrical continuity therebetween. Membrane keyboard circuits have proven to be effective and durable in a wide range of applications and have permitted sealed keyboard constructions wherein exposure of the internal circuit elements to environmental moisture and contaminants is prevented. In keyboard constructions of this type, a number of keys with various character elements thereon are printed on a single flat flexible sheet which represents the face of the keyboard. Depression of the keys on the keyboard causes flexing of a membrane circuit to effect continuity in the manner hereinabove described.

One of the primary methods for manufacturing printed circuit boards has heretofore been to etch copper laminates utilizing conventional negative photoresist procedures. A circuit image of a resist material is first printed on the copper laminate and acid is applied to remove the undesired portions of the copper, leaving only the portion of the copper which is in the desired circuit image. While this procedure has generally been effective for producing circuit boards of acceptable quality, it is not a completely desirable procedure in that substantial amounts of pollution frequently result from effluents that are emitted during the etching process.

A second well-known method of manufacturing printed circuits has comprised screen printing of electrically conductive inks on rigid or flexible substrates. This method has also been less than fully satisfactory in that in order to provide satisfactory flow and binding characteristics in the ink used, the inks must contain substantial quantities of binding agents. On the other hand, in order to provide sufficient circuit conductivity in the circuit, the inks must contain relatively high quantities of metallic particles. Because of these competing constraints, it has proven necessary to use highly expensive high conductive particles of precious metals, such as silver, to achieve the desired circuit conductivity and still maintain adequate binding characteristics. The high cost of silver has proven to be a major drawback in circuits of this type. In addition, it has proven necessary to use comparatively corrosive solvents in the ink which actually attack the substrate in order to achieve proper binding of the ink. Consequently, when the ink is heated to drive off the solvents, substantial quantities of corrosive pollutants are emitted. The heat required in this instance also has drawbacks in that it frequently causes unwanted substrate deformation.

The instant invention provides a novel and unique process for forming electrically conductive circuits on substrates which has none of the major drawbacks of the previously known methods. It is effective for forming durable printed circuit boards without the use of copper laminates, heat cured inks, precious metals or corrosive solvents. In particular, the method of the instant invention utilizes innovative ultraviolet photo technology to form electricaly conductive circuits on translucent substrates. An ultraviolet reactive ink which comprises a mixture of unsaturated monomers and oligomers is screen printed on a substrate in the desired circuit image. The ink is then partially polymerized or cured to an elastic or tacky state by exposing it to a limited amount of ultraviolet radiation. A wax or silicone-based resist emulsion is then screen printed on the substrate in the negative image of the desired circuit. Molecular particles of a conductive metal (which need not be a precious metal) are then sprayed on the ink by electrostatically accelerated vacuum deposition. This forms a dense crystalline layer of metallic particles on the partially cured ink. Since the particles are accelerated during the deposition thereof, a portion of them are actually embedded into the semicured ink to assure proper adhesion of the metallic layer. The substrate is then exposed to ultraviolet radiation a second time to effect final polymerization or curing of the ink. In the final curing step, ultraviolet radiation is applied to the ink from both sides of the substrate. This is done because the metallic particles on the ink tend to reflect ultraviolet radiation applied from the upper side of the substrate so that only a limited amount of radiation reaches the ink which obviously has the effect of inhibiting the curing thereof. By applying radiation to both sides of the translucent substrate, the radiation passes through the substrate and reaches the ink from the under side thereof to assist in the complete curing of the ink. After the ink has been fully cured to a hardened state, the resist material is removed from the circuit board utilizing a conventional solvent, leaving only the fully-formed circuit on the substrate.

Both the method of the instant invention and the circuit thereby formed have significant advantages over their prior art counterparts. In particular, the method of the instant invention is carried out without the use of precious metals or substantial quantities of heat. The method of the instant invention is practical and economical and produces virtually no air pollutants. The circuit boards produced are rugged and durable. Further, since the metallic layer deposited on the ink is a comparatively dense homogeneous layer, it is suitable for connection with other circuit components by soldering.

Accordingly, it is an object of the instant invention to provide a method of forming an electrically conductive printed circuit without the use of precious metals.

Another object of the instant invention is to provide a method of manufacturing electrically conductive printed circuits which produces no effluents.

A still further object of the instant invention is to provide an electrically conductive printed circuit board to which electrical components may be soldered.

An additional object of the instant invention is to provide a durable electrically conductive printed circuit board.

Other objects, features and advantages of the invention shall become apparent as the description thereof proceeds when considered in connection with the accompanying illustrative drawings.

DESCRIPTION OF THE DRAWING

In the drawings which illustrate the best mode presently contemplated for carrying out the present invention:

FIG. 8A is a fragmentary side sectional view of the substrate with the ink, resist material and metallic particles thereon;

FIG. 9 is a side elevational view of the apparatus for effecting final curing of the ultraviolet reactive ink;

FIG. 10 is a side elevational view illustrating the removal of the negative resist material from the substrate;

FIG. 11 is a perspective view of the completed circuit board;

FIG. 12 is an enlarged sectional view taken along line 12—12 in FIG. 11;

FIG. 13 is a view taken along line 13—13 in FIG. 9 illustrating the conveyor belt of the curing apparatus;

FIG. 13A is a perspective view of a circuit board of an alternative embodiment of the method utilizing an apertured substrate;

FIG. 14 is an enlarged side sectional view taken along line 14—14 in FIG. 14A; and FIG. 15 is a similar view illustrating positioning of the apertured substrate during the formation of the circuit thereon.

DESCRIPTION OF THE INVENTION

Figure 1:
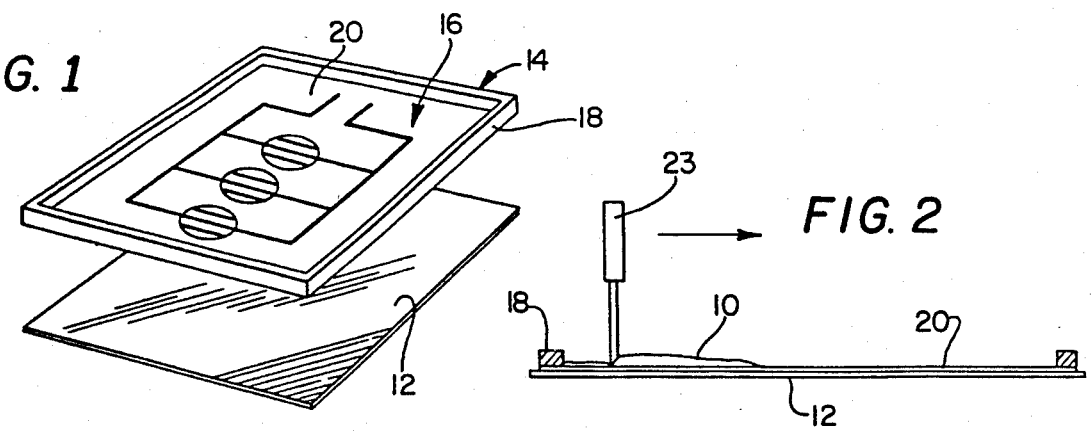
FIG. 1 is a perspective view illustrating the screen printing of the ultraviolet reactive ink on the substrate in the desired circuit image.

Referring now to the drawings, the method of the instant invention is illustrated in FIGS. 1 through 10.

Figure 2:
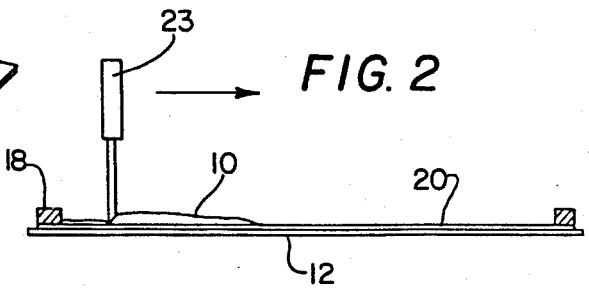
FIG. 2 is a side sectional view illustrating the application of the ultraviolet reactive ink to the printing screen with the substrate therebeneath.

The first step of the method is illustrated in FIGS. 1 and 2 and comprises the application of an ultraviolet reactive ink 10 to a translucent substrate 12 in the image of the desired circuit utilizing a conventional screen printing assembly 14.

The substrate 12 preferably comprises a flat sheet of polyester or polycarbonate which may be either flexible or rigid but must be at least partially translucent (preferably more than 50% translucent). Substrates which have been print treated by conventional means such as by exposure to corona discharge or by the application of acrylic coatings thereto are most effective in that they have improved surface texture characteristics and are therefore highly receptive to the ink 10. Conventional print treated Mylar (Dupont TM) has proven to be an effective commercially available substrate, although certainly the use of various other suitable substrates is contemplated.

The ink 10 comprises an ultraviolet reactive mixture of unsaturated acrylated monomers and oligomers, the proportions of which may be varied to alter the physical characteristics of the ink in both its cured and uncured states as desired and as is well known in polymer chemistry. The use of conventional ultraviolet sensitive photo initiators in the ink 10 is also contemplated although in some instances this may cause over-polymerization of the ink 10 during the initial curing thereof.

The screen assembly 14 comprises a conventional printing screen 16 which is supported in a frame 18, it being understood that the screen has been prepared with conventional screen printing techniques to provide an impervious area 20 which defines an open circuit image 22. The assembly 14 is first overlaid on the substrate 12 in a conventional manner and then an even layer of the ink 10 is applied to the screen 16 utilizing a conventional squeegee 23 to form a circuit image of the ink 10 on the substrate 12.

The ink 10 on the substrate 12 is then partially cured or polymerized to an elastic or tacky state by exposing it to ultraviolet radiation. In this regard, when the ink 10 is exposed to ultraviolet radiation, the organic molecules in the ink polymerize both with themselves and with the substrate 12 whereby proper adhesion of the ink 10 on the substrate 12 is assured. The apparatus illustrated in FIG. 3 generally indicated at 24 is utilized to effect the polymerization of the ink 10 and comprises a housing 26, a conveyor assembly 28 which utilizes a belt 29 which is mounted in the housing 26, and a plurality of ultraviolet light assemblies 30 which are disposed in substantially transverse relation above and beneath the conveyor assembly 28. The light assemblies 30 comprise pairs of elongated tubular ultraviolet lights 32 which are focused on the conveyor assembly 28 with elongated transverse semiparabolic mirrors 34. In order to permit the passage of ultraviolet light from the lower lights 32 through the conveyor belt 29 when they are energized, the belt 29 preferably comprises a mesh belt of the type illustrated in FIG. 13.

Figure 3:
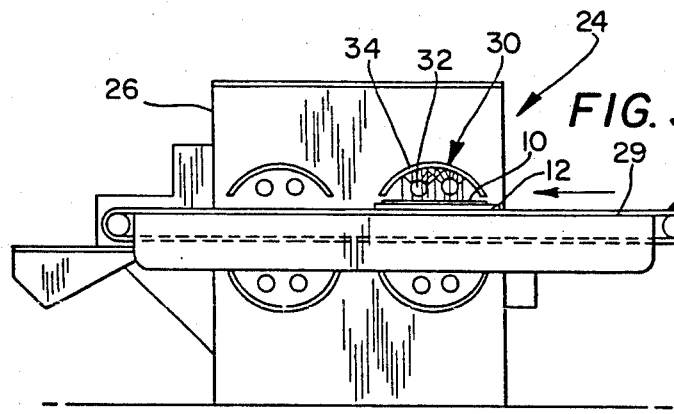
FIG. 3 is a side elevational view of the apparatus for curing the ultraviolet reactive ink to effect partial curing thereof.

In the second step of the method of the instant invention, the ink 10 is only partially cured. Generally, partial curing of the ink 10 may be effected with the application of a very limited amount of ultraviolet radiation although obviously the precise amount of radiation required in each instance depends on the composition of the particular ink utilized. In most instances, however, during the partial curing step, the apparatus 10 is operated with only a single upper light assembly 30 energized as is illustrated in FIG. 3, and this provides sufficient radiation to effect the desired polymerization of the ink 10 in a very short period of time. Also, although not absolutely essential, it is desirable to effect curing of the ink 10 in an oxygen free atmosphere to prevent oxidation thereof. In particular, a nitrogen atmosphere in the apparatus 24 has proven effective during curing of the ink 10.

Figure 4:
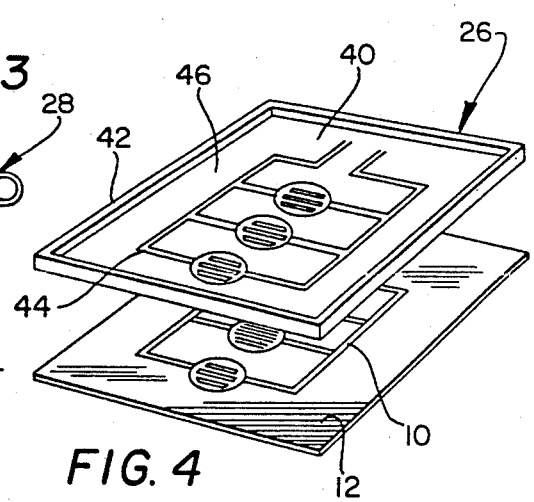
FIG. 4 is a perspective view illustrating the screen printing of the resist material on the substrate in the negative image of the circuit.
Figure 5:
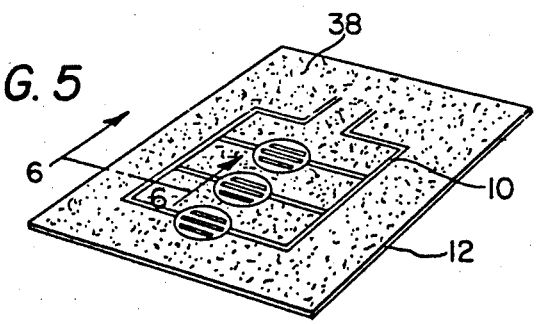
FIG. 5 is a perspective view of the substrate with the ultraviolet reactive inks and the resist material thereon.
Figure 6:
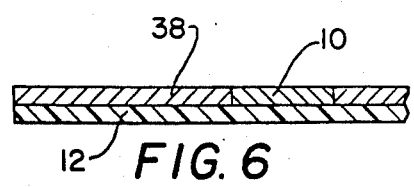
FIG. 6 is an enlarged sectional view taken along line 6—6 in FIG. 5.

While it is possible to deposit the metallic particles which provide electrical conductivity in the circuit of the instant invention on the ink 10 immediately after partial curing thereof, for reasons that will hereinafter be discussed, it is preferable to first provide a resist coating on the substrate 12 in the negative image of the desired circuit. The next step of the preferred method, therefore, comprises a second screen printing step as illustrated in FIG. 4 wherein a second screen printing assembly 36 is utilized to apply a wax or silicone based resist material 38 to the substrate 12. The assembly 36 comprises a screen 40 which is supported by a frame 42 and which has an impervious area 44 in the image of the desired circuit and an open area 46 in the negative image of the circuit. The second printing assembly 36 is overlaid on the substrate 12 with the partially cured ink 10 thereon and the resist material 38 is applied to the screen 40 to form a negative image of the resist material 38 on the substrate 12. The resist material 38 is heated to a liquid state and comprises a wax or silicone based emulsion which preferably solidifies to at least a partially hardened state in a short period of time at normal room temperature and which is preferably soluble in a well known solvent, such as cellosolve acetate. When the resist material hardens, it provides a protective shield on the substrate 12 whereby the accidental deposition of metallic particles thereon during the following steps of the method is prevented.

Figure 7:
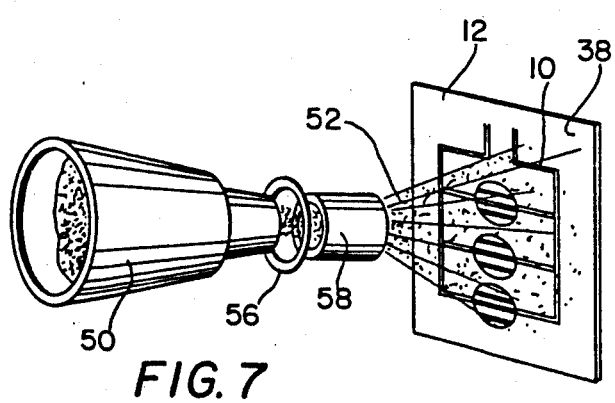
FIG. 7 is a perspective view of the deposition of metallic particles on the ultraviolet reactive ink.
Figure 8:
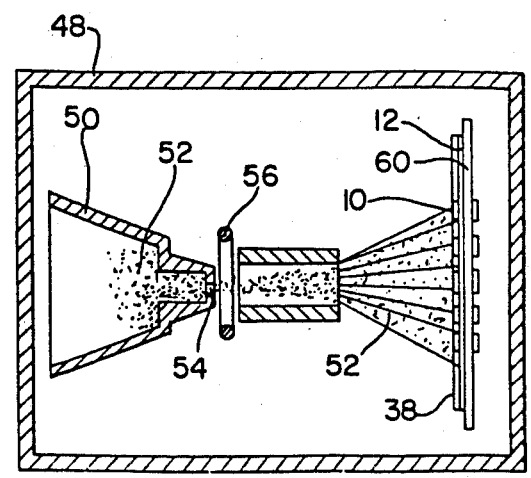
FIG. 8 is a schematic side sectional view of the metallic particle deposition apparatus.

After the resist material 38 on the substrate 12 has solidified, the metallic particles which provide electrical conductivity in the circuit are applied to the partially cured ink 10 by vacuum deposition, as illustrated schematically in FIGS. 7 and 8. The vacuum deposition process relies on metal vaporization to effect the deposition thereof and is therefore carried out in a vacuum chamber 48 which is maintained at a vacuum of between $1 \times 10^{-7}$ TORR. and $1 \times 10^{-7}$ TORR. A metal having natural highly crystalline characteristics, preferably selected from the group consisting of aluminum, nickel, copper, chromium, silver or gold, is placed in a crucible 50 in the chamber 48 and the crucible 50 is heated to an elevated temperature of between 900° and 2300° C. (depending on the vaporization temperature of the particular metal). As the metal is vaporized in the crucible 50, vaporized metallic particles 52 are emitted under pressure through an orifice 54 in the crucible 50. As particles 52 pass through the orifice 54, they are sprayed toward the substrate 12 with the ink 10 and the resist material 38 thereon, whereby a certain portion of the particles is deposited on the tacky, partially cured ink 10 to form a conductive metallic layer thereon.

To improve the deposition of the vaporized particles 52 on the partially cured ink 10, it has been found advantageous to electrostatically accelerate the particles 52 during deposition thereof. For this reason an electrically charged ionizing electrode ring 56 is provided in substantially concentric relation to the orifice 54 to ionize the particles 52 immediately after they have passed therethrough. The ionized particles 52, which are electrically charged, are then passed through an accelerator tube 58 which is electrically charged with a charge of the same polarity as the particles 52. Since the ionized particles 52 are repelled by the similarly charged tube 58, the resultant effect is that they are accelerated as they pass through the tube 58 towards the substrate 12. To further enhance the acceleration of the particles 52 and to focus the deposition thereof on the partially cured ink 10 rather than on the resist material 38, an electrically charged grid circuit 60 is provided behind the substrate 12 in the chamber 48. The grid circuit 60 comprises a circuit of substantially the same configuration as the circuit image of the partially cured ink 10 and is disposed in registry therewith behind the substrate 12. The grid circuit 60 is charged with a charge of opposite polarity from the ionized particles 52 whereby an electrical attraction is created therebetween. This increases acceleration of the ionized particles 52 towards the substrate 12 and attracts them primarily toward the partially cured ink 10. The sectional illustration of the substrate 12 with the ink 10, the resist material 38, and the metallic particles 52 thereon in FIG. 8A illustrates the effect of focusing the particles 52 with the grid 60. It should also be brought out that during the above described metal deposition, particles of certain metals are receptive to charges of particular polarity and therefore the polarity of the charge on the ring 56, the tube 58 and the circuit 62 must be adapted accordingly.

The electrostatic acceleration of the particles 52 during the deposition thereof has two major effects on the deposition process. Since the particles 52 are imparted with substantially increased kinetic energy, a significant portion of the particles 52 are actually embedded into the partially cured ink 10 on the substrate 12 This results in significantly improved mechanical adhesion of the metallic layer to the ink 10. Furthermore, as the particles 52 gradually form a metallic layer on the ink 10, they form metallic crystals in accordance with their normal physical properties. By imparting increased kinetic energy to the particles 52 during the deposition thereof, the metallic layer thereby formed is of significantly increased density with the crystalline particles which comprise the metallic layer in intimate physical contact. This has the ultimate effect of reducing the specific resistivity of the resultant circuit, or expressed differently, increasing the conductivity thereof, an obviously highly desirable characteristic for printed circuits.

After the desired metallic layer has been formed on the partially cured ink 10, the substrate 12 with the ink 10, the resist material 38, and the particles 52 thereon, is removed from the chamber 48 and once again exposed to ultraviolet radiation to effect final curing of the ink 10. The final curing step is also preferably carried out in an oxygen-free nitrogen atmosphere for the reasons hereinabove described and may be carried out with the apparatus 24. In contrast to the earlier partial curing step, it is desirable to effect final curing of the ink 10 by applying ultraviolet radiation thereto from both sides of the substrate 12. Hence, in the final curing step, it is desirable to operate the apparatus 24 in the manner illustrated in FIG. 9 wherein all four of the light assemblies 30 are energized. The metallic particles 52 on the partial cured ink 10 tend to reflect ultraviolet light applied to the upper side of the substrate 12 and therefore tend to inhibit curing of the ink 10. Accordingly, by applying ultraviolet light to both sides of the translucent substrate 12, it is possible to complete full curing of the ink 10 by utilizing the additional effects of the ultraviolet light as it passes through the substrate 12 from the underside thereof and is absorbed by the ink 10. This also promotes further polymerization of the ink 10 with the substrate 12 to provide both chemical and mechanical bonding of the ink 10 thereto and permits the ink 10 to be polymerized to a hardened, cured state in a relatively short period of time.

After the ink 10 has been finally cured, the resist material 38 is removed from the substrate 10 utilizing a suitable solvent such as cellosolve acetate. Although obviously the solvent can be applied to the resist material 38 by various methods, the solvent applicator generally indicated at 62 in FIG. 10 is effective in commercial applications. The apparatus 62 comprises a frame 64 having a plurality of reticulated urethane foam rollers 66 which are used to apply the solvent to the resist materials 38. After the resist material 38 has been completely removed from the substrate 12, the fully formed circuit board generally indicated at 68 in FIGS. 11 and 12 remains comprising the substrate 12, the fully cured circuit image of ink 10, and the layer of metallic particles 52 deposited on the ink 10.

The method of the instant invention is also applicable to the formation of electrically conductive printed circuits on apertured substrates whereby the apertures in the substrates form sockets for receiving the pins of electrical components. The circuit generally indicated at 70 in FIGS. 14, 14A and 15 is illustrative in this regard. As will be seen, when utilizing a substrate 72 having one or more apertures 74 therein, which are in communication with the desired circuit image, and when the ink 10 is applied thereto, it flows through the apertures 74 and onto the adjacent portions of the rear side of the board 72. Thereafter, when the metallic particles 52 are applied in the vacuum deposition step, some of the particles 52 also extend into the apertures 74 adhering to the ink 10 therein to form electrically conductive sockets 76. To permit the ink 10 and the metallic particles 52 to pass through the apertures 74, it is desirable to position the substrate 72 in slightly spaced relation to the supporting surface therebeneath during printing of the ink 10 and in slightly spaced relation to the grid 60 during the deposition of the metallic particles 52. This is done by utilizing spacers 78, as illustrated in FIG. 15

It is seen, therefore, that the instant invention provides a unique and novel method for forming electrically conductive printed circuits on translucent substrates. The method uses the novel concept of curing the ultraviolet reactive ink from both above and beneath the substrate to assure complete polymerization thereof. Further, by electrostatically accelerating the metallic particles during vacuum deposition thereof, it is possible to form a conductive circuit of comparatively low specific resistivity. The method is equally applicable to the forming of circuits on rigid and flexible boards. It is also applicable to the forming of circuits on apertured boards to provide miniature sockets for the pins of electrical components. The circuits formed by the method of the instant invention are both rugged and durable. Since the circuits may be formed without the use of precious metals, they are comparatively inexpensive to manufacture, making them very practical. For all of these reasons, both the method of the instant invention and the circuits thereby formed represent revolutionary improvements in the technology relating to electrically printed circuits which are of substantial commercial significance.

While there is shown and described herein certain specific structure embodying this invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An electrically conductive circuit board comprising:
    an at least partially translucent substrate;
    a first layer of substantially metal-free hardened material comprising an ultraviolet reactive ink bonded to portions of said substrate; and
    a second, electrically conductive layer formed on said first layer by depositing metallic particles onto said first layer subsequent to partial curing and prior to full curing of said material.

2. A circuit board as in claim 1 wherein said metallic particles are deposited by vacuum deposition.

3. A circuit board as in claim 1 wherein:
    said substrate includes means for defining at least one aperture therethrough;
    a portion of said first layer is bonded to a surface of said substrate within said aperture; and
    a portion of said second layer is deposited on said portion of said first layer bonded within said aperture.

4. A circuit board as in claim 1 wherein some of said metallic particles are embedded in said first layer.

5. A circuit board as in claim 1 wherein said deposited metallic particles form metallic crystals.

6. A circuit board as in claim 1 wherein said substrate comprises one of polyester and polycarbonate.

7. An electrically conductive socket formed on a substrate and adapted for accepting a lead of an electrical component, said socket comprising:
    an at least partially translucent substrate;
    means for defining an aperture in said substrate, at least a first surface of said substrate being disposed within said aperture;
    a first layer of substantially metal-free hardened material comprising an ultraviolet reactive ink bonded to said substrate surface; and
    a second, electrically conductive layer formed on said first layer by depositing metallic particles onto said first layer subsequent to partial curing and prior to full curing of said material.

8. A socket as in claim 7 wherein said metallic particles are deposited by vacuum deposition.

9. A socket as in claim 7 wherein said metallic particles are embedded in said first layer.

10. A socket as in claim 7 wherein said deposited metallic particles form metallic crystals.

11. A socket as in claim 7 wherein said substrate comprises one of polyester and polycarbonate.

12. An electrically conductive circuit board produced by:
    applying a polymerizable material comprising an ultraviolet reactive ink to an at least partially translucent substrate in substantially the desired image of a circuit;
    partially curing said material to form a tacky surface;
    depositing metallic particles onto said tacky surface; and
    finally curing said material to a hardened state including directing ultraviolet radiation through said substrate onto said material.

13. A circuit board as in claim 12 wherein said polymerizable material is substantially metal-free.

14. A circuit board as in claim 12 wherein said polymerizable material is metal-free.

15. A circuit board as in claim 12 wherein said substrate comprises one of polyester and polycarbonate.

16. A circuit board as in claim 12 wherein some of said particles are embedded in said material.

17. A circuit board as in claim 12 wherein said particles are deposited by vacuum deposition.

18. A circuit board as in claim 12 wherein:
said substrate includes means for defining at least one aperture;
said polymerizable material is applied to a surface of said substrate within said aperture; and
said metallic particles are deposited onto said material applied within said aperture.

19. An electrically conductive socket formed on a substrate which is at least partially translucent and adapted for accepting a lead of an electrical component, said socket produced by:

applying a polymerizable material comprising an ultraviolet reactive ink to a surface within an aperture defined by a substrate;
partially curing said material to form a tacky surface thereon;
depositing metallic particles onto said tacky surface; and
finally curing said material to a hardened state including directing ultraviolet radiation through said substrate onto said material.

20. A socket as in claim 19 wherein said polymerizable material is substantially metal-free.

21. A socket as in claim 19 wherein said polymerizable material is metal-free.

22. A socket as in claim 19 wherein said substrate comprises one of polyester and polycarbonate.

23. A socket as in claim 19 wherein some of said particles are embedded in said material.

24. A socket as in claim 19 wherein said particles are deposited by vacuum deposition.

* * * * *